US011605277B2

United States Patent
Xu et al.

(10) Patent No.: US 11,605,277 B2
(45) Date of Patent: Mar. 14, 2023

(54) SYSTEMS, METHODS, AND DEVICES FOR FIRE CONTROL SYSTEM POWER SWITCHING

(71) Applicant: Honeywell International Inc., Charlotte, NC (US)

(72) Inventors: Xiaoka Xu, Glastonbury, CT (US); Arkady Gordon, Bethany, CT (US)

(73) Assignee: Honeywell International Inc., Charlotte, NC (US)

( * ) Notice: Subject to any disclaimer, the term of this patent is extended or adjusted under 35 U.S.C. 154(b) by 374 days.

(21) Appl. No.: 17/008,172

(22) Filed: Aug. 31, 2020

(65) Prior Publication Data

US 2022/0068100 A1 Mar. 3, 2022

(51) Int. Cl.
| | | |
|---|---|---|
| G08B 17/06 | (2006.01) | |
| A62C 3/08 | (2006.01) | |
| H02M 7/155 | (2006.01) | |

(52) U.S. Cl.
CPC .............. G08B 17/06 (2013.01); A62C 3/08 (2013.01); H02M 7/155 (2013.01)

(58) Field of Classification Search
CPC ........... G08B 17/06; A62C 3/08; H02M 7/155
USPC ...................................................... 340/289
See application file for complete search history.

(56) References Cited

U.S. PATENT DOCUMENTS

| | | | | |
|---|---|---|---|---|
| 5,568,129 A | * | 10/1996 | Sisselman ............ | G08B 29/145 340/309.7 |
| 5,646,486 A | * | 7/1997 | Edwards ............... | H02J 7/0069 315/86 |
| 5,896,907 A | * | 4/1999 | Dever ..................... | E05F 15/72 160/9 |
| 7,098,782 B1 | * | 8/2006 | Peckham ............... | G08B 17/10 340/517 |
| 9,059,636 B2 | * | 6/2015 | Lehn ....................... | H02M 3/01 |

(Continued)

OTHER PUBLICATIONS

Fei, et al., "Soft Start-up for High Frequency LLC Resonant Converter with Optimal Trajectory Control", 2015 IEEE Applied Power Electronics Conference and Exposition (APEC), Mar. 15-19, 2015, 7 pages.

(Continued)

*Primary Examiner* — Kerri L McNally
*Assistant Examiner* — Thang D Tran
(74) *Attorney, Agent, or Firm* — Brooks, Cameron & Huebsch, PLLC

(57) ABSTRACT

Systems, methods, and devices for fire control system power switching are described herein. One embodiment includes an alternating current (AC) power source, a battery, a notification component, and a control circuit, comprising an LLC circuit comprising an LLC controller component, a transformer component, a rectifier and feedback component, and an opto-coupler component. The LLC circuit can be configured to reduce an LLC output voltage from a first LLC voltage to a second LLC voltage while the notification component is using power supplied by the battery. The control circuit can include a battery-plane voltage transfer component configured to disconnect the battery from a plane voltage of the control circuit and an AC/DC-plane transfer component configured to connect the second LLC output voltage to the plane voltage to supply power from the AC power source.

20 Claims, 9 Drawing Sheets

(56) References Cited

U.S. PATENT DOCUMENTS

| | | | | |
|---|---|---|---|---|
| 2011/0133655 | A1* | 6/2011 | Recker | H05B 47/13 |
| | | | | 315/159 |
| 2011/0273112 | A1* | 11/2011 | Lee | H05B 45/50 |
| | | | | 315/307 |
| 2012/0250360 | A1* | 10/2012 | Orr | H02M 3/335 |
| | | | | 363/21.02 |
| 2013/0314949 | A1* | 11/2013 | Chi | H02M 7/53871 |
| | | | | 363/17 |
| 2015/0077243 | A1* | 3/2015 | Hooper | G08B 17/06 |
| | | | | 340/532 |
| 2015/0171757 | A1* | 6/2015 | Jin | H02M 3/33553 |
| | | | | 363/21.04 |
| 2017/0093299 | A1* | 3/2017 | Norimatsu | H02M 3/335 |
| 2017/0117717 | A1* | 4/2017 | Pagano | H02J 50/10 |
| 2020/0074920 | A1* | 3/2020 | Lee | G09G 3/3208 |
| 2020/0080739 | A1* | 3/2020 | Koss | F24F 11/62 |
| 2020/0304015 | A1* | 9/2020 | Liu | H02M 3/33507 |
| 2020/0321878 | A1* | 10/2020 | Zhang | H02M 7/483 |
| 2020/0372785 | A1* | 11/2020 | Barson | G08B 29/06 |
| 2020/0402380 | A1* | 12/2020 | Barson | G08B 5/36 |
| 2021/0312780 | A1* | 10/2021 | Morita | G08B 17/113 |

OTHER PUBLICATIONS

Mohammadi, et al., "Inrush Current Limit or Extreme Startup Response for LLC Converters Using Average Geometric Control", IEEE Transactions on Power Electronics, vol. 33, Issue 1, Jan. 2018, 16 pages.

* cited by examiner

SYSTEMS, METHODS, AND DEVICES FOR FIRE CONTROL SYSTEM POWER SWITCHING

TECHNICAL FIELD

The present disclosure relates generally to systems, methods, and devices for fire control system power switching.

BACKGROUND

Large facilities (e.g., buildings), such as commercial facilities, office buildings, hospitals, and the like, may have a fire alarm system that can be triggered during an emergency situation (e.g., a fire) to warn occupants to evacuate. For example, a fire alarm system may include a fire control panel and a plurality of notification devices (e.g., alarms, horns, strobes, etc.) that provide notification of the fire to the occupants of the facility.

Such systems are typically powered by an alternating current/direct current (AC/DC) power supply and commonly employ a battery system in order to supply power when the AC/DC power supply is down, disconnected, or otherwise unavailable. In cases where power is being supplied by the battery system when the AC/DC power supply returns and before the battery system is disconnected, the battery system may work as an extra load on the fire alarm system. This extra load may cause a "short" condition and may add stress, causing failure of the AC/DC power supply system. In some cases, bulk capacitors in the fire alarm system can trigger the AC/DC power supply system to enter into a mode to protect itself from over current conditions, which can cause the AC/DC power supply system from starting as well.

Previous approaches include soft switching using trajectory control, LLC resonant converter(s) and/or relays. However, LLC resonant converters may themselves be stressed during startup. To address these stresses, previous approaches may utilize dedicated control circuits, which come with drawbacks including undesirable expense and sensitivity to noise. Relays can be large in size, short-lived, expensive, and noisy-potentially resulting in intermittent connection.

DETAILED DESCRIPTION

Figure 1:
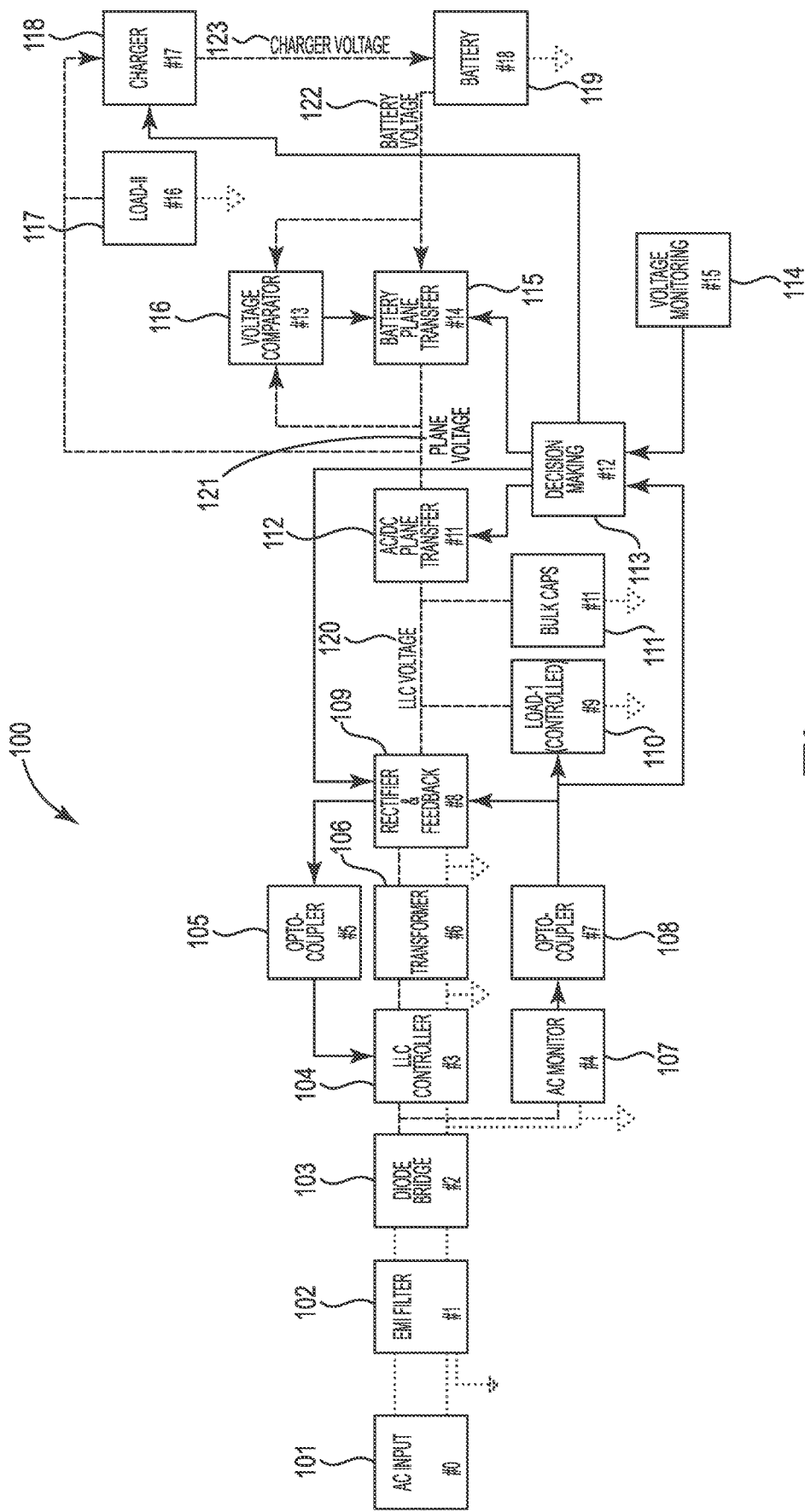
FIG. 1 illustrates a system for fire control system power switching in accordance with one or more embodiments of the present disclosure.
Figure 2A:
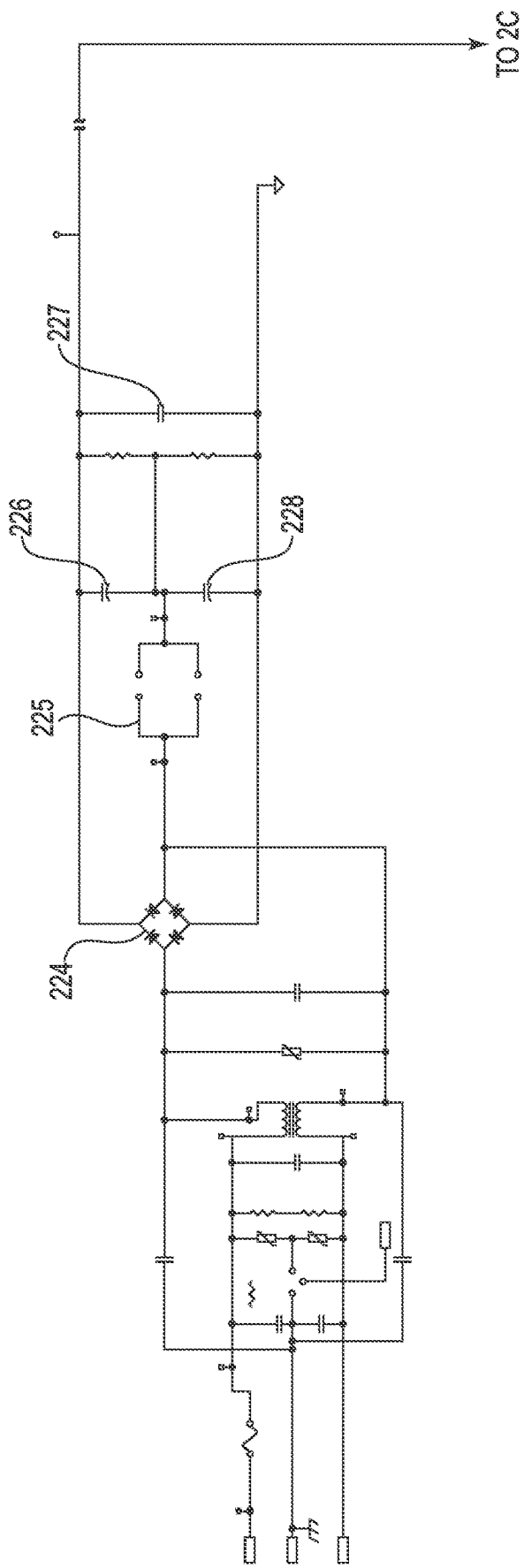
FIG. 2A illustrates a portion of an example circuit associated with the system illustrated in FIG. 1.
Figure 2B:
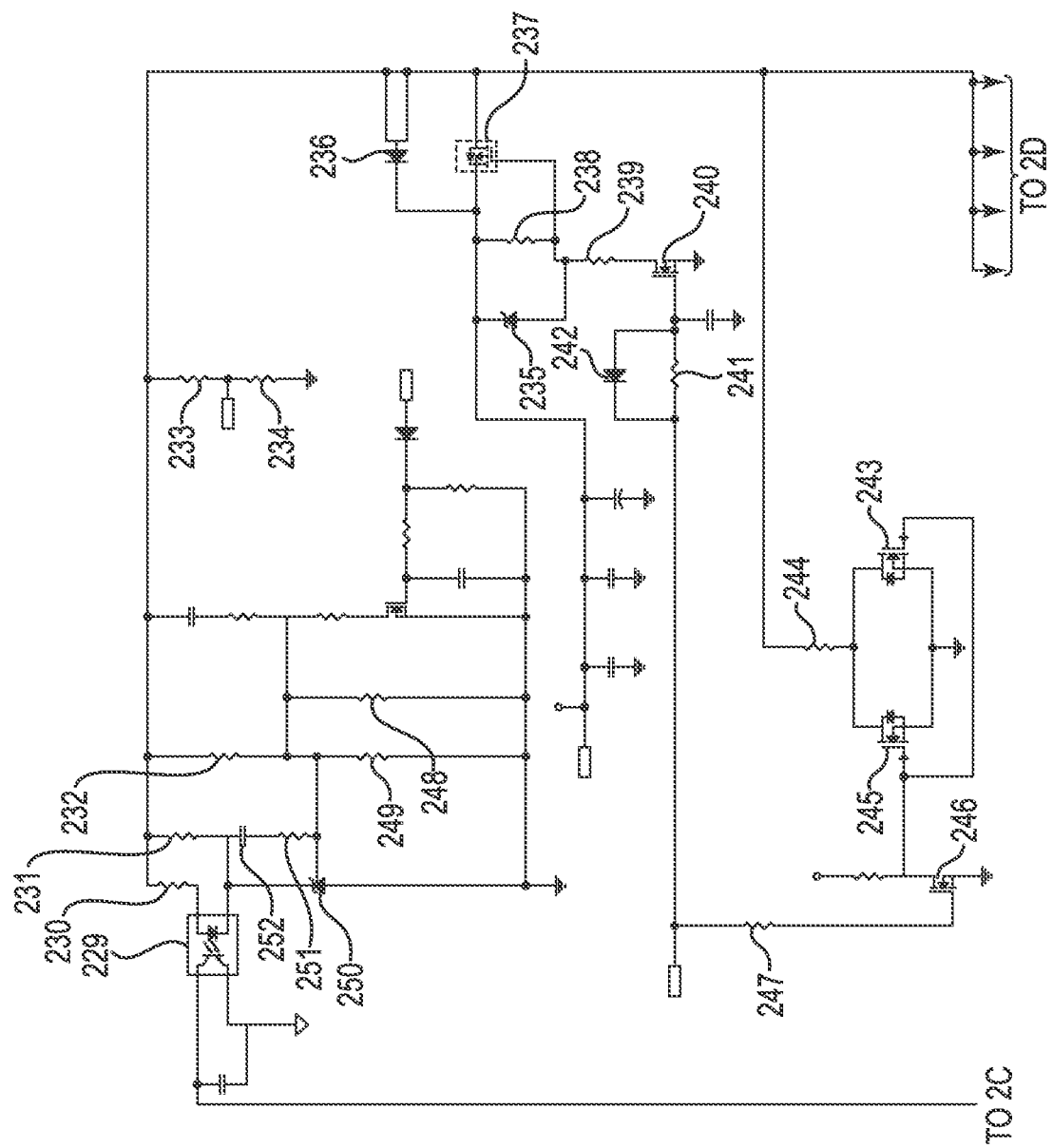
FIG. 2B illustrates another portion of the example circuit associated with the system illustrated in FIG. 1.
Figure 2C:
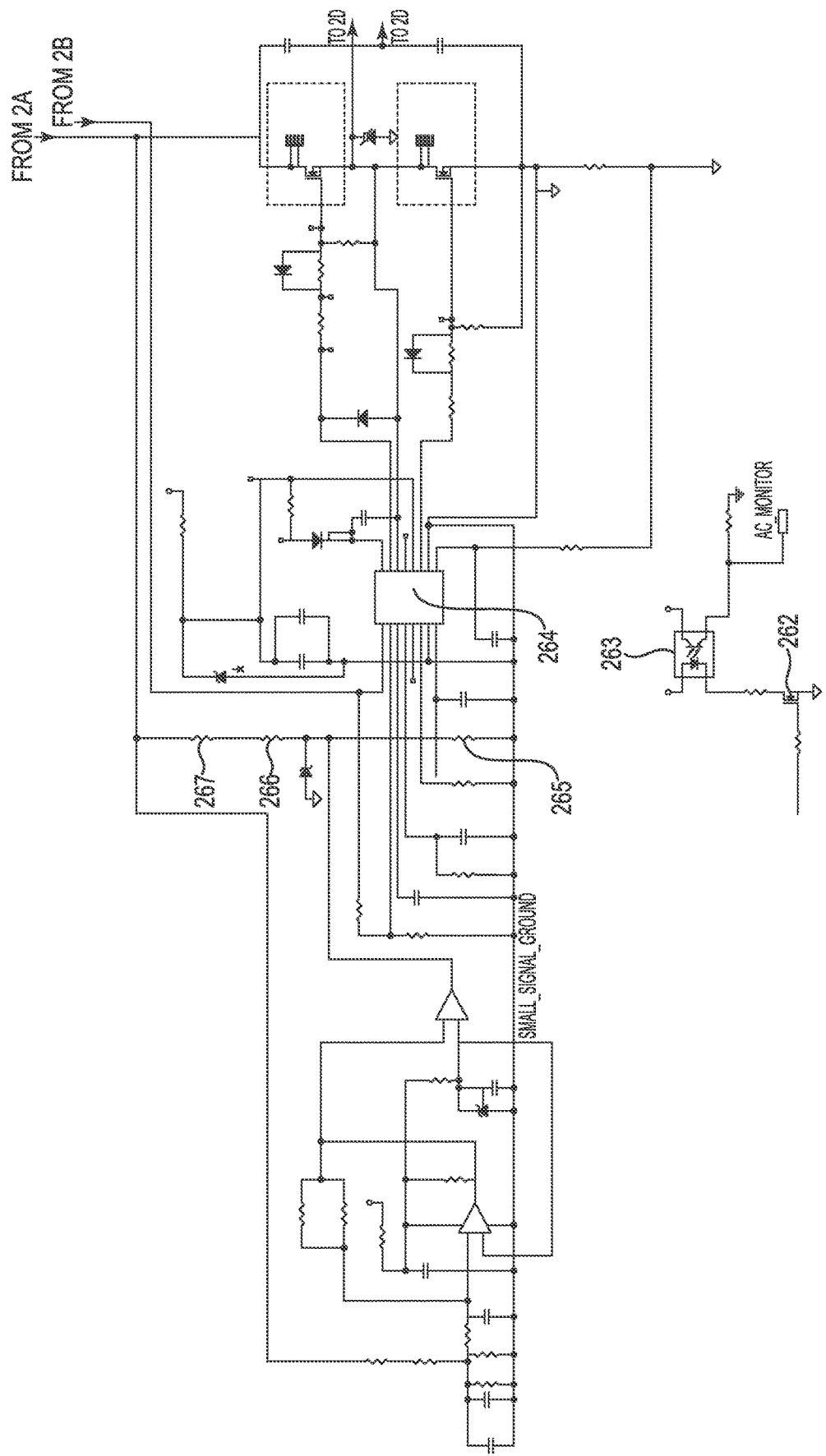
FIG. 2C illustrates another portion of the example circuit associated with the system illustrated in FIG. 1.
Figure 2D:
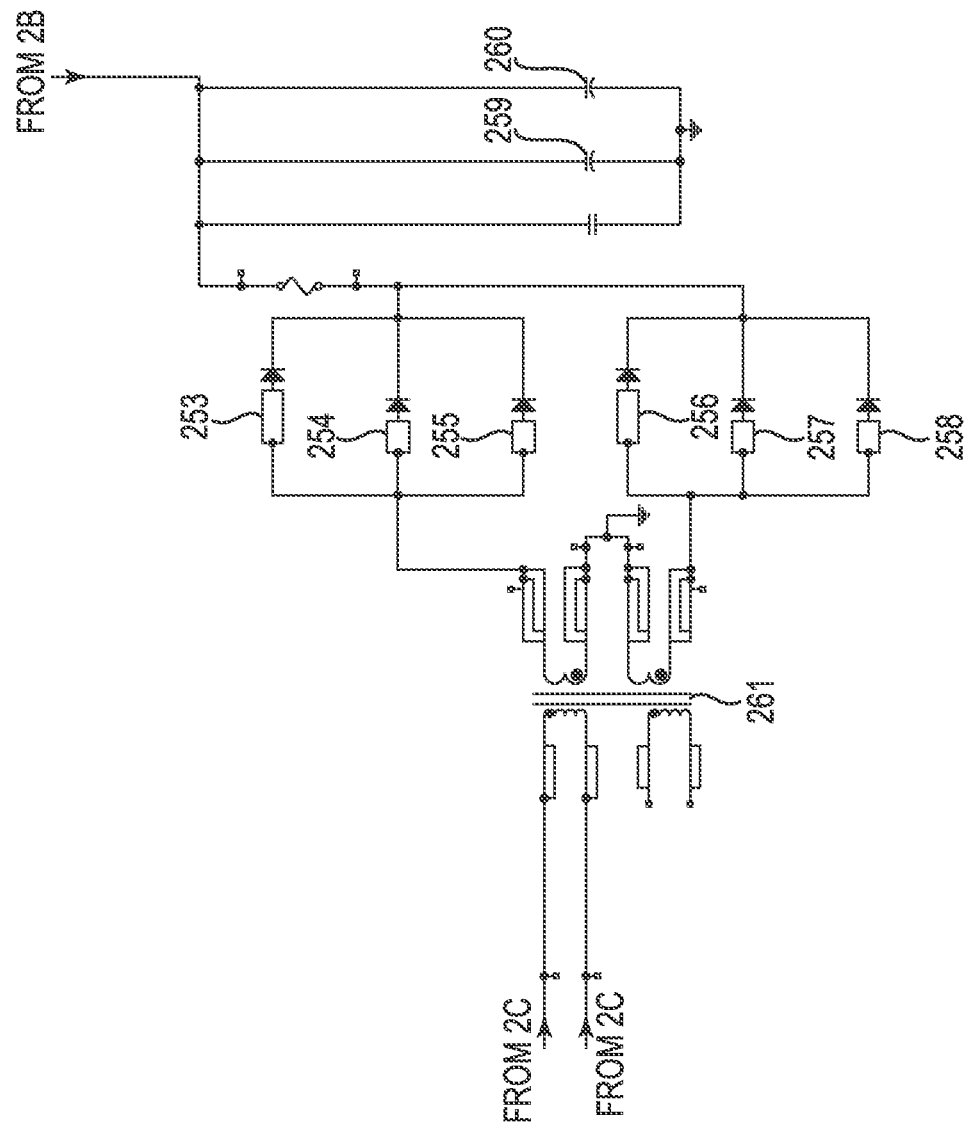
FIG. 2D illustrates another portion of the example circuit associated with the system illustrated in FIG. 1.
Figure 2E:
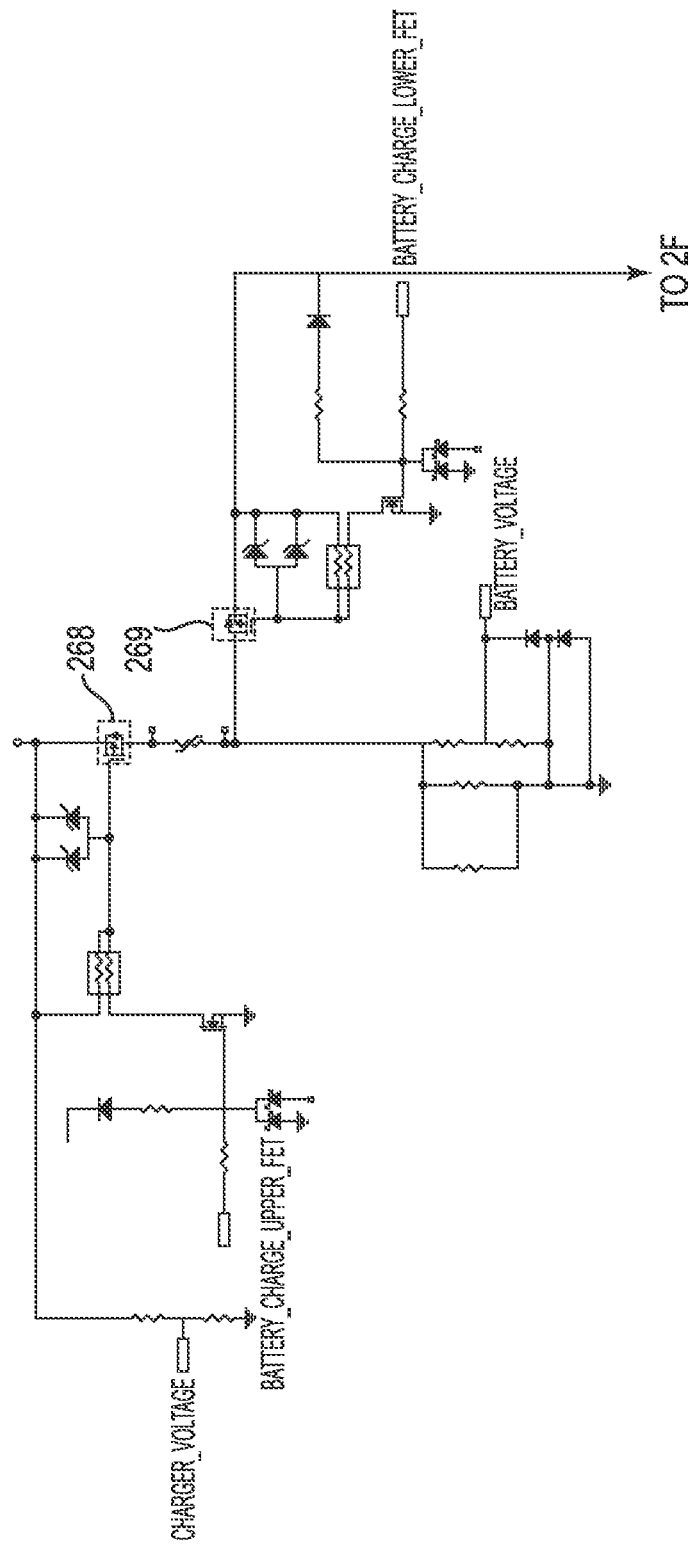
FIG. 2E illustrates another portion of the example circuit associated with the system illustrated in FIG. 1.
Figure 2F:
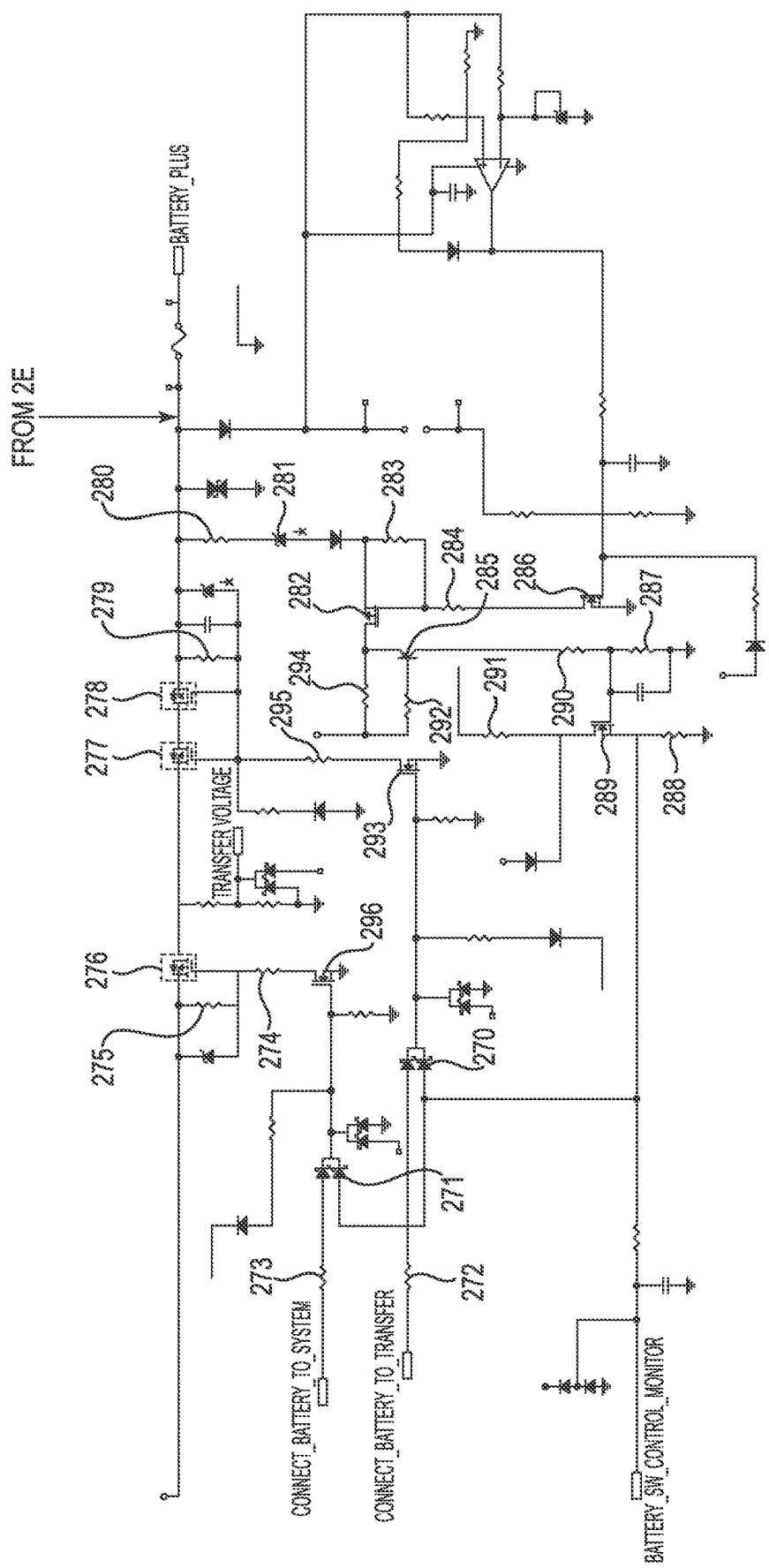
FIG. 2F illustrates another portion of the example circuit associated with the system illustrated in FIG. 1.
Figure 2G:
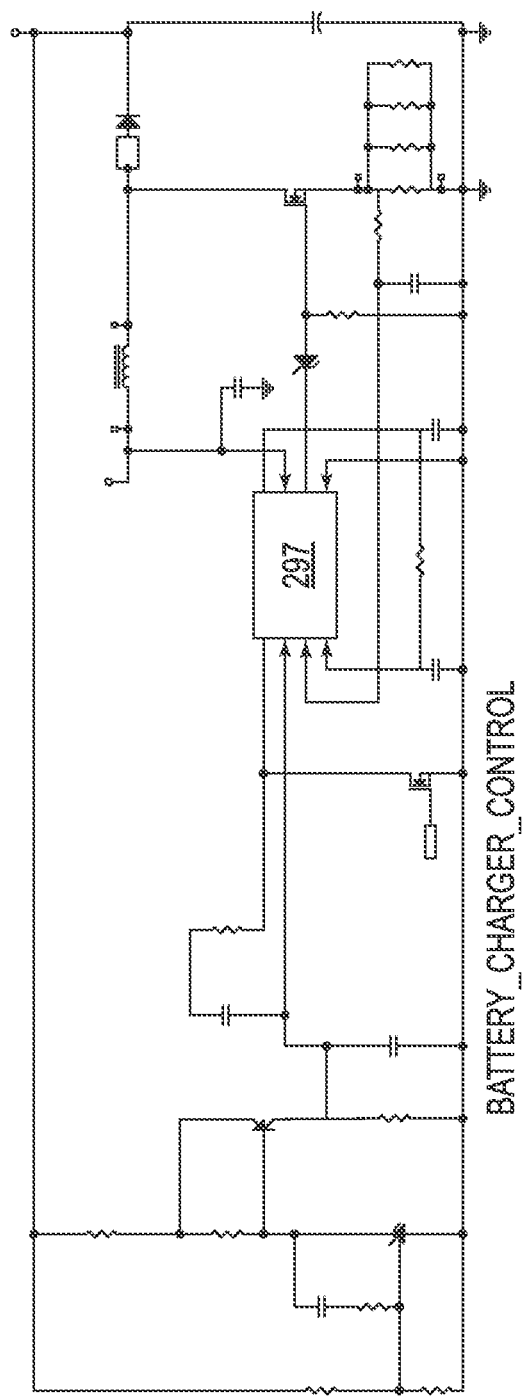
FIG. 2G illustrates another portion of the example circuit associated with the system illustrated in FIG. 1.

Systems, methods, and devices for fire control system power switching are described herein.

Embodiments of the present disclosure can enable soft switching without the dedicated control circuits and/or relays of previous approaches. As a result, embodiments herein can enable a fire control system to transition from AC/DC power to battery power, and vice versa, without the undesirable expense and/or sensitivity to noise that accompany previous approaches. The present disclosure makes reference to power supplied by an AC/DC power supply system. AC/DC power, as it is referred to herein, is an alternative to battery power. Various embodiments herein are powered by DC power. DC power can be sourced from a battery or can be converted from AC power (e.g., from an electrical outlet). If power is received from an AC outlet, it can be converted to DC power by an AC/DC converter (e.g., an LLC resonant converter). Generally, AC/DC, as referred to herein, includes power received from an electrical outlet.

Embodiments herein can isolate the battery of a fire control system from the AC/DC switcher and can relieve stress associated with the startup of an LLC resonant converter (sometimes referred to herein simply as "LLC"). In addition, embodiments herein can be implemented using metal-oxide semiconductor field-effect transistors (MOSFETs), which may exhibit increased robustness against noise compared to previous approaches.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that mechanical, electrical, and/or process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

The figures herein follow a numbering convention in which the first digit or digits correspond to the drawing figure number and the remaining digits identify an element or component in the drawing.

As used herein, "a", "an", or "a number of" something can refer to one or more such things, while "a plurality of" something can refer to more than one such things. For example, "a number of components" can refer to one or more components, while "a plurality of components" can refer to more than one component.

FIG. 1 illustrates a system 100 for fire control system power switching in accordance with one or more embodiments of the present disclosure. FIGS. 2A-2G illustrate an example circuit associated with the system 100 illustrated in FIG. 1. Reference may be made herein alternately to FIG. 1 and FIGS. 2A-2G.

One or more portions of the system 100 can be (or be a portion of) a controller (e.g., a microcontroller), for instance. For instance, a portion of the system 100 can be implemented on a printed circuit board (PCB), though embodiments of the present disclosure are not so limited.

As shown in FIG. 1, the system 100 can include an AC input component 101. The AC input component 101 can receive AC power (e.g., from an electrical outlet). As shown in FIG. 1, the system 100 can include an EMI filter component 102. The EMI filter component 102 can mitigate high-frequency electromagnetic noise that can cause interference.

As shown in FIG. 1, the system 100 can include a diode bridge component 103. In the example illustrated in FIGS. 2A-2G, the diode bridge component 103 may comprise a diode bridge 224, a connector jack 225, a capacitor 226, a capacitor 228, and a capacitor 227. In some embodiments, the diode bridge component 103 can include a voltage doubler, which, in the example illustrated in FIGS. 2A-2G, can be enabled through connector jack 225.

As shown in FIG. 1, the system 100 can include an LLC controller 104. In the example illustrated in FIGS. 2A-2G, the LLC controller is shown as integrated circuit (e.g., microcontroller) 264.

As shown in FIG. 1, the system 100 can include a first opto-coupler component 105. The first opto-coupler component can include circuitry configured to provide feedback of a regulated LLC voltage 120. In the example illustrated in FIGS. 2A-2G, the first opto-coupler component 105 can comprise integrated circuit 229.

As shown in FIG. 1, the system 100 can include a transformer component 106. The transformer component 106 is shown in the example illustrated in FIGS. 2A-2G as transformer 261.

As shown in FIG. 1, the system 100 can include an AC monitor component 107. The AC monitor component 107 samples a portion of the DC voltage from the diode bridge component 103 (e.g., diode bridge 224 in FIGS. 2A-2G) through a resistor divider network (shown in FIGS. 2A-2G as comprising a resistor 267, a resistor 266, and a resistor 265). The sampled voltage controls the second optocoupler component 108 through a MOSFET, for instance, (e.g., MOSFET 262 shown in the example illustrated in FIGS. 2A-2G).

As shown in FIG. 1, the system 100 can include a second opto-coupler component 108. The second opto-coupler component 108 can comprise an integrated circuit, for instance, such as integrated circuit 263 shown in the example illustrated in FIGS. 2A-2G. The second opto-coupler component 108 can include circuitry configured to provide an indication of whether AC power is on or off and/or brownout information for a decision-making component 113 (discussed further below) through an AC monitor (e.g., AC_MONITOR illustrated in the example of FIGS. 2A-2G). The decision-making component 113 controls the AC/DC plane transfer component 112 (discussed below), the controlled load component 110 (discussed below), and the battery-plane voltage transfer component 115 (discussed below). The second opto-coupler component 108 can provide galvanic isolation between AC mains and lower voltage components, such as the output voltage of the power supply (e.g., the controlled load component 110) and the control circuit (e.g., the voltage monitoring component 114).

As shown in FIG. 1, the system 100 can include a rectifier and feedback component 109. In the example illustrated in FIGS. 2A-2G, rectifier aspects of the rectifier and feedback component 109 can comprise a plurality of diodes 253, 254, 255, 256, 257, and 258, and feedback aspects of the rectifier and feedback component 109 can comprise a plurality of resistors 230, 231, 251, 232, 249, and 248, an integrated circuit 250, and a capacitor 252. The rectifier and feedback component 109 can receive the indication of whether AC power is on or off from the decision-making component 113 (e.g., via CONNECT_BATTERY_TO_SYSTEM) and can provide feedback information to the first opto-coupler component 105.

As shown in FIG. 1, the system 100 can include a controlled load component 110. In the example illustrated in FIGS. 2A-2G, the controlled load component 110 can comprise a plurality of transistors (e.g., MOSFETs) 246, 245, 243, and a resistor 244. The controlled load component 110 can be connected to drain out charge from the bulk capacitor component 111 when AC power is off. The controlled load component 110 can be disconnected to reduce power consumption (e.g., unnecessary power consumption) when AC power is on. In the example illustrated in FIGS. 2A-2G, for instance, the controlled load component 110 can receive a control message from AC_MONITOR buffered by a resistor 247.

As shown in FIG. 1, the system 100 can include a bulk capacitor component 111. In the example illustrated in FIGS. 2A-2G, the bulk capacitor component 111 can comprise a plurality of capacitors 259 and 260.

As shown in FIG. 1, the system 100 can include an AC/DC plane transfer component 112. The AC/DC plane transfer component 112 can include circuitry configured to provide a control point between LLC voltage 120 and plane voltage 121. In the example illustrated in FIGS. 2A-2G, the AC/DC plane transfer component 112 can include a power circuit comprising diode 236, a transistor (e.g., MOSFET) 237, and a control circuit comprising a diode 242, a plurality of resistors 241, 239, 238, a transistor (e.g., MOSFET) 240, and a Zener diode 235.

As shown in FIG. 1, the system 100 can include a decision-making component 113 (e.g., an integrated circuit or microcontroller, not shown in FIGS. 2A-2G). The decision-making component 113 can receive information from AC monitoring (e.g., second opto-coupler component 108) and/or DC monitoring (e.g., voltage monitoring component 114) and determine whether to connect plane voltage 121 with LLC voltage 120 or with battery voltage 122. In some embodiments, the decision-making component 113 can determine whether to turn on the charger circuit 118 to provide a charger voltage 123 for the battery (or batteries) 119.

As shown in FIG. 1, the system 100 can include a voltage monitoring component 114. In the example illustrated in FIGS. 2A-2G, the voltage monitoring component 114 can comprise a resistor network 233 and 234, and an analog-to-digital converter (ADC) in the decision-making component 113.

As shown in FIG. 1, the system 100 can include a battery-plane voltage transfer component 115. In the example illustrated in FIGS. 2A-2G, the battery-plane voltage transfer component 115 can comprise a plurality of power transistors (e.g., MOSFETs) 276, 277, and 278, and their associated control logic components: a plurality of resistors 273, 272, 274, 275, 295, 279, a plurality of diodes 271, 270, and a plurality of transistors (e.g., MOSFETs) 296 and 293.

As shown in FIG. 1, the system 100 can include a voltage comparator component 116. The voltage comparator component 116 can include circuitry configured to compare the battery voltage 122 with the plane voltage 121. In the example illustrated in FIGS. 2A-2G, the voltage comparator component can include a plurality of resistors 280, 283, 284, 294, 292, 290, 287, 291, 288, a plurality of diodes 270, 271, D133, a plurality of transistors (e.g., MOSFETs) 286, 282, 285, 289, and a Zener diode 281.

In some embodiments, the voltage comparator component 116 activates the battery if the battery voltage is 6V higher than the plane voltage regardless of the AC voltage status from decision-making component 113. Such activation can be performed to ensure that loads such as horn and strobes (e.g., notification load component 117) are powered. The voltage comparator component 116 can additionally relieve the strict timing control of the software from the decision-making component 113.

As shown in FIG. 1, the system 100 can include a notification load component 117. The notification load component 117 can be a load comprising notification devices of the fire control system. Such devices include, for example, lights, horns, strobes, alarms, displays, etc.

As shown in FIG. 1, the system 100 can include a charger 118 (e.g., charger circuit 118). The charger 118 can include circuitry configured to charge the battery 119. The charger 118 can be configured to be deactivated during AC recovery for stress relief (discussed further below). In the example illustrated in FIGS. 2A-2G, the charger 118 can include a current path comprising a plurality of transistors (e.g., MOSFETs) 268 and 269 (and associated control logic). The charger 118 can increase the voltage through the integrated circuit 297 and its surrounding circuit.

As shown in FIG. 1, the system 100 can include a battery 119. The battery 119 can be a 24-volt battery, for instance, though it noted that embodiments of the present disclosure are not so limited.

Figure 3:
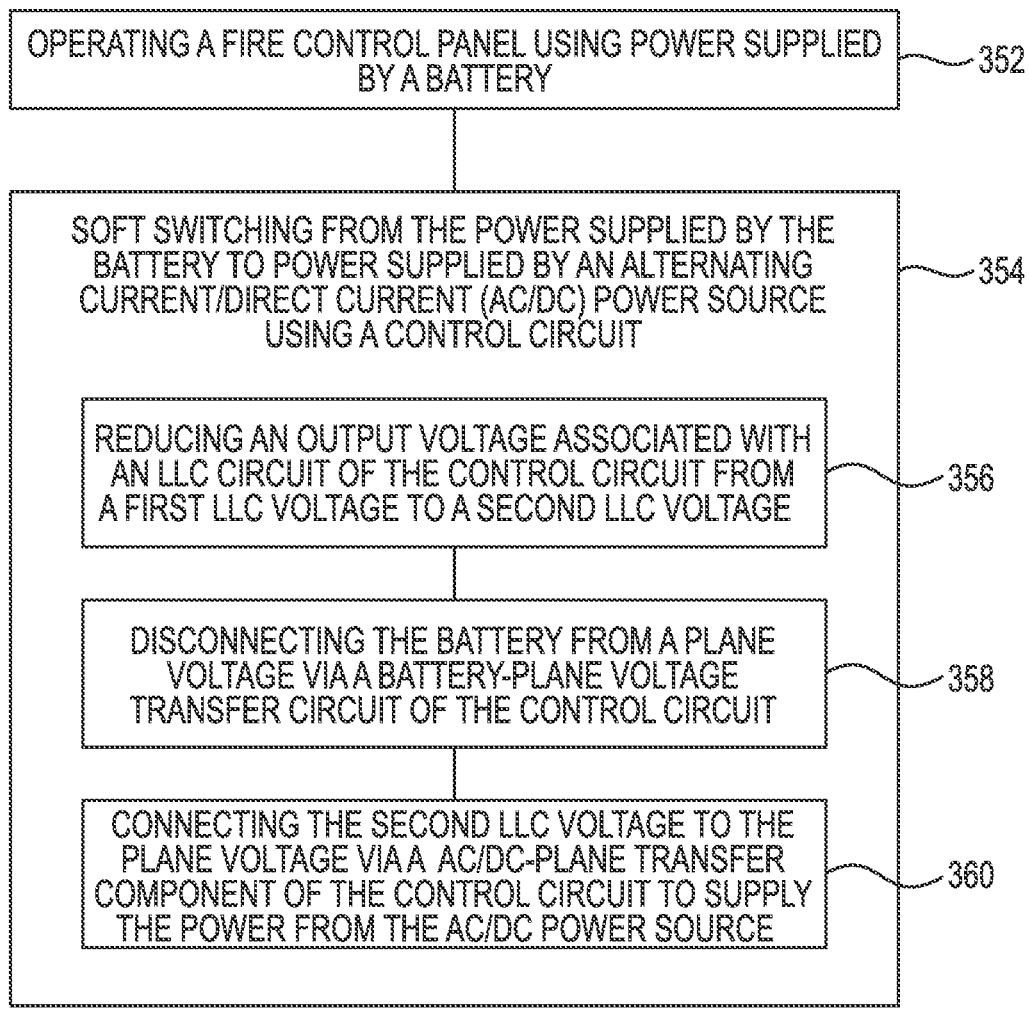
FIG. 3 illustrates a method for fire control system power switching in accordance with one or more embodiments of the present disclosure.

FIG. 3 illustrates a method 350 for fire control system power switching in accordance with one or more embodiments of the present disclosure. The method 350 can be performed by a control system and/or circuit, for instance, such as the system 100, previously described in connection with FIG. 1. It is noted that in the discussion related to FIG. 3, reference may occasionally be made to elements previously discussed in FIG. 1.

At 352, the method 350 includes operating a fire control panel using power supplied by a battery. When the AC power supply is off, the battery may be used to power the fire control system. During a period of battery power, the controlled load component 110 can be connected to drain out bulk capacitors of the bulk capacitor component 111. As a result, the system 100 has a reduced (e.g., minimum) load. The plane voltage 121 can exceed the battery voltage 122 (e.g., the maximum battery voltage). During a period of time in which the AC power supply recovers, the system 100 can remain in a state of reduced load. The LLC voltage 120 can be maintained at a first (e.g., elevated) LLC voltage. The first LLC voltage can exceed a second (e.g., normal) LLC voltage. In some embodiments, for instance, the first LLC voltage during periods of battery-supplied power may be approximately 27 V and the second (e.g., normal) LLC voltage may be approximately 24 V.

At 354, the method 350 includes soft switching from the power supplied by the battery to power supplied by an alternating current/direct current (AC/DC) power source using a control circuit. Soft switching can be carried out responsive to a determination that the power supplied by the AC/DC power source has returned to a stable state (e.g., within a target range). At 356, soft switching includes reducing an output voltage associated with an LLC circuit of the control circuit from a first LLC voltage (e.g., 27 V) to a second LLC voltage (e.g., 24 V).

At 358, soft switching includes disconnecting the battery from a plane voltage via a battery-plane voltage transfer circuit of the control circuit (e.g., the battery-plane voltage transfer component 115, previously described in connection with FIG. 1). At 360, soft switching includes connecting the second LLC voltage to the plane voltage via an AC/DC-plane transfer component of the control circuit to supply the power from the AC/DC power source. With reference to FIG. 1, for instance, the second LLC voltage 120 can be connected to the plane voltage 121 via AC/DC-plane transfer component 112. Such a connection can allow power from the AC/DC power source 101 to be supplied to the fire control system rather than power from the battery 119.

When power from the AC/DC power source 101 is deactivating, embodiments herein can switch back to battery power. Such deactivation can be determined using the AC monitor component 107. The decision-making component 113 connects the battery 119 to the plane voltage 121 through the battery-plane voltage transfer component 115. During deactivation of AC/DC power, some embodiments include connecting a controlled load component (e.g., controlled load component 110) and disconnecting an AC/DC-plane transfer component (e.g., AC/DC-plane transfer component 112) to operate the fire control panel using power supplied by the battery. The plane feedback voltage (e.g., plane voltage 121) can be set in excess of an indicated voltage associated with the battery via a rectifier and feedback component (e.g., rectifier and feedback component 109) of the control circuit.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A fire control system, comprising;
an alternating current (AC) power source;
a battery;
a notification component;
a control circuit, comprising:
an LLC circuit comprising an LLC controller component, a transformer component, a rectifier and feedback component, and an opto-coupler component, wherein the LLC circuit is configured to reduce an LLC output voltage from a first LLC voltage to a second LLC voltage while the notification component is using power supplied by the battery;

a battery-plane voltage transfer component configured to disconnect the battery from a plane voltage of the control circuit;

an AC/DC-plane transfer component configured to connect the second LLC output voltage to the plane voltage to supply power from the AC power source.

2. The system of claim 1, further comprising a controlled load component, wherein:

when the AC power source is off and the battery is on, the controlled load component is configured to be connected to the control circuit.

3. The system of claim 1, wherein the controlled load component includes a resistor and a N-MOSFET.

4. The system of claim 3, further comprising a bulk capacitor component including a plurality of bulk capacitors.

5. The system of claim 4, wherein each of the plurality of bulk capacitors has a capacitance of 2200 microfarads.

6. The system of claim 4, wherein the plurality of bulk capacitors are configured to drain responsive to a connection of the controlled load component to the control circuit.

7. The system of claim 1, wherein the battery-plane voltage transfer component includes a plurality of back-to-back P-MOSFETS.

8. The system of claim 1, wherein the AC/DC plane transfer component includes a P-MOSFET.

9. The system of claim 1, wherein the battery-plane voltage transfer component is configured to disconnect the battery from the plane voltage of the control circuit and the AC/DC-plane transfer component is configured to connect the second LLC output voltage to the plane voltage to supply power from the AC power source responsive to a determination that the power supplied by the AC power source has returned to a stable state.

10. The system of claim 1, wherein the notification component includes a plurality of notification devices of the fire control system.

11. The system of claim 1, wherein the plurality of notification devices includes a plurality of lights and alarms.

12. A method for fire control system power switching, comprising:

operating a fire control panel using power supplied by a battery;

soft switching from the power supplied by the battery to power supplied by an alternating current/direct current (AC/DC) power source using a control circuit, wherein soft switching comprises:

reducing an output voltage associated with an LLC circuit of the control circuit from a first LLC voltage to a second LLC voltage;

disconnecting the battery from a plane voltage via a battery-plane voltage transfer circuit of the control circuit; and connecting the second LLC voltage to the plane voltage via a AC/DC-plane transfer component of the control circuit to supply the power from the AC/DC power source.

13. The method of claim 12, wherein the method includes reducing the output voltage associated with the LLC circuit of the control circuit from the first LLC voltage to the second LLC voltage, wherein the first voltage is 27 Volts, and wherein the second voltage is 24 Volts.

14. The method of claim 12, wherein the method includes connecting a controlled load component to operate the fire control panel using power supplied by the battery.

15. The method of claim 14, wherein the method includes operating the fire control panel using power supplied by the battery while the AC/DC-plane transfer component is disconnected from the control circuit.

16. The method of claim 15, wherein connecting the controlled load component to the control circuit drains a plurality of bulk capacitors of the control circuit.

17. The method of claim 15, wherein the method includes setting the plane voltage in excess of an indicated voltage associated with the battery via a rectifier and feedback component of the control circuit.

18. The method of claim 12, wherein the method includes:

determining that the power supplied by the AC/DC power source is deactivating subsequent to connecting the second LLC voltage to the plane voltage via the AC/DC-plane transfer component to supply the power from the AC/DC power source;

reconnecting the battery to the plane voltage via the battery-plane voltage transfer circuit;

disconnecting the AC/DC-plane transfer component from the control circuit; and draining a plurality of bulk capacitors of the control circuit.

19. The method of claim 18, wherein the method includes determining that the power supplied by the AC/DC power source is deactivating using a voltage comparator component associated with the battery-plane voltage transfer circuit.

20. The method of claim 18, wherein the method includes soft switching from the power supplied by the battery to power supplied by the AC/DC power source responsive to a determination that the power supplied by the AC/DC power source has returned to a stable state.

* * * * *